United States Patent [19]

Kooi et al.

[11] 4,113,515

[45] Sep. 12, 1978

[54] SEMICONDUCTOR MANUFACTURING METHOD USING BURIED NITRIDE FORMED BY A NITRIDATION TREATMENT IN THE PRESENCE OF ACTIVE NITROGEN

[75] Inventors: Else Kooi; Joseph Gijsbertus vanLierop, both of Eindhoven, Netherlands

[73] Assignee: U.S. Philips Corporation, New York, N.Y.

[21] Appl. No.: 671,419

[22] Filed: Mar. 29, 1976

Related U.S. Application Data

[63] Continuation-in-part of Ser. No. 592,867, Jul. 3, 1975, abandoned.

[30] Foreign Application Priority Data

Jun. 4, 1975 [NL] Netherlands ................ 7506594

[51] Int. Cl.² .................. H01L 21/265; H01L 21/31
[52] U.S. Cl. ............................ 148/1.5; 29/578;
148/187; 357/23; 357/24; 357/42; 357/54;
427/94; 427/248 B
[58] Field of Search ............... 148/1.5, 187; 427/94,
427/248 B; 29/578; 357/54

[56] References Cited

U.S. PATENT DOCUMENTS

| B 554,164 | 3/1976 | Graul et al. | 427/94 X |
|---|---|---|---|
| 3,622,382 | 11/1971 | Brack et al. | 148/1.5 X |
| 3,755,014 | 8/1973 | Appels et al. | 148/187 |
| 3,771,218 | 11/1973 | Langdon | 148/187 X |
| 3,783,047 | 1/1974 | Paffen et al. | 148/187 |
| 3,788,894 | 1/1974 | Scherber | 427/94 X |
| 3,793,088 | 2/1974 | Eckton, Jr. | 148/1.5 |
| 3,798,061 | 3/1974 | Yamazaki | 427/248 B |
| 3,874,919 | 4/1975 | Lehman | 427/94 X |
| 3,897,274 | 7/1975 | Stehlin et al. | 148/1.5 |
| 3,924,024 | 12/1975 | Naber et al. | 427/94 X |

Primary Examiner—L. Dewayne Rutledge
Assistant Examiner—W. G. Saba
Attorney, Agent, or Firm—Frank R. Trifari; Jack Oisher; Steven R. Biren

[57] ABSTRACT

The invention relates to a method of manufacturing a semiconductor device in which a surface of a silicon semiconductor region covered at least partly with a silicon oxide-containing layer is subjected to a nitridation treatment forming a buried zone of a nitrogen-containing material between the silicon oxide layer and the silicon region, which zone is used in a further phase of the manufacture or in the manufactured semiconductor device.

25 Claims, 20 Drawing Figures

SEMICONDUCTOR MANUFACTURING METHOD USING BURIED NITRIDE FORMED BY A NITRIDATION TREATMENT IN THE PRESENCE OF ACTIVE NITROGEN

This application is a continuation-in-part of a prior copending application. Ser. No. 592,867 filed July 3, 1975, now abandoned.

This invention relates to a method of manufacturing a semiconductor device having a semiconductor region of silicon which is covered at least partly with a silicon oxide-containing layer, and in particular to a semiconductor device having a silicon region with a genetic silicon oxide layer.

"Genetic" is to be understood to mean herein a part of the semiconductor device which is formed by a treatment of the silicon region. In the case of a genetic oxide layer, the treatment is oxidation. The expression "silicon oxide-containing layer" is to be understood to mean herein the type of silicon oxide layers which are commonly used in semiconductor technology, for example, as a mask for diffusing dopant material, as an etchant mask, for passivating p-n junctions, as a dielectric, and for insulating conductor tracks on the silicon surface. The silicon region may be formed by a monocrystalline body but may also be a part of such a body, for example, a homo-or heteroepitaxial layer on a substrate. The silicon region may also consist of polycrystalline silicon.

The silicon oxide-containing layers are often obtained by thermal oxidation of a monocrystalline silicon body. At or in the proximity of the interface between the silicon and the silicon oxide, imperfections may occur so that the electric properties of the semiconductor device to be manufactured can be influenced, generally in a harmful manner. It is usual to divide the imperfections into two types, first, oxide charges which are usually positive, and, second, centers ("surface states") which can exchange charge with the silicon.

It is also known that in addition to silicon oxide-containing layers for the above-mentioned and other applications in semiconductor technology, layers having a different composition, for example, of silicon nitride, have been used, for example, for masking silicon surfaces during selective oxidation treatments. The formation of silicon nitride on a silicon surface, which usually takes place by deposition from the gaseous phase, is difficult to perform in such manner that a silicon surface with the desired properties is obtained. It has been found in practice, for example, that under the influence of electric fields charge exchange between the silicon and imperfections at or near the silicon surface are possible. This is possibly based on the fact that in practice a silicon surface is covered at least partly with an undesired oxide layer which is difficult to remove completely.

A general object of the invention is to provide a novel method for controlling or improving or modifying the properties of the silicon surface.

The invention is based, among other things, on the discovery that, although silicon nitride will mask or prevent the oxidation of silicon to silicon oxide, the reverse, namely, masking by silicon oxide against nitridation of a silicon surface, need not occur.

The method of the invention is characterized in that an oxide-covered silicon region is subjected to a nitridation treatment producing a functional buried zone which consists of a nitrogen-containing material between or at the interface of the silicon oxide layer and the silicon region. The expression "functional" is to be understood to mean that the thus-produced zone is thereafter used during a further phase of the manufacture of the device or in the manufactured semiconductor device.

It will become apparent hereinafter that the thus-formed buried zone has properties which are similar to those of the known deposited silicon nitride layers and thus can be used in the same manner. Therefore, the formed buried zone will for simplicity be referred to hereinafter as a silicon nitride zone, though this is not meant to exclude the possibility that the material of the buried zone is a silicon oxide-nitride or may also include hydrogen or oxygen. The important fact is that the quality of the thus-formed silicon nitride buried zone is reproducible and homogeneous both due to the small number of imperfections at the interface between the silicon and the silicon nitride buried zone and by its homogenous formation below a silicon oxide layer provided beforehand and intentionally. Also, the silicon nitride buried zone where it is formed is continuous over the whole silicon-silicon oxide interface, except where masked as will be explained hereinafter.

The invention will now be described in greater detail with respect to a number of preferred embodiments thereof, reference being had to the accompanying drawings wherein.

Before continuing with the detailed description of the preferred embodiments, some general comments concerning the application of the method of the invention will assist those skilled in this art in understanding better its scope.

The thickness of the covering silicon oxide-containing layer is generally not critical. It has been found that the method according to the invention can be used effectively when comparatively thin silicon oxide-containing layers are present on the silicon surface. Preferably, the silicon oxide-containing layer has a thickness exceeding 100 A. As regards the upper limit of thickness of the silicon oxide layer, the normally used thicknesses in the semiconductor art, up to approximately 4 μm, are suitable for use in the method according to the invention. Preferably, a silicon oxide layer is used which covers the silicon region partly and is sunken in the silicon region at least over a part of its thickness. Such sunken oxide layers formed by selective oxidation are known in the art. When the silicon region is covered obly partly with the silicon oxide layer, the silicon nitride zone that forms will be buried under the oxide, but may also extend over the part of the silicon region not covered by oxide and will thus be exposed.

Silicon nitride buried zones with good properties are obtained even when the zone is thin. The thickness of the silicon nitride zone is preferbly chosen to be larger than 5 A. Silicon nitride zones having a thickness varying from, for example, 5 A to a few tens of A, for example 50 A, are obtained in a particularly simple manner in a preferred embodiment of the method according to the invention in which the nitridation treatment comprises a treatment of the oxide-covered silicon region at an elevated temperature in an ammonia-containing atmosphere. For example, the atmosphere can comprise a few per cent, by volume, of ammonia. For instance, heating a silicon wafer with an 0.1 μm thick oxide for 16 hours at 1000° C in an $N_2$ gas flow containing 5% $NH_3$, flow rate 3 l/min for a 10 cm wide quartz tube, will produce a buried nitride zone of about 10 A thickness. The method according to the invention is not restricted to the above-mentioned thickness of the silicon nitride zone. Thicker silicon nitride zones can be formed at higher pressures of the gas atmosphere.

A gas flow having a volume concentration of ammoina which is smaller than 50% by volume is preferably used in the nitridation treatment, among other things, for increased safety. As a carrier gas for the ammonia is preferably used an inert carrier gas, for example, nitrogen or a rare gas. With the expression "inert gas" is meant a gas which is substantially non-reactive with respect to the silicon in comparison with the chosen nitriding agent. The flow rate is not critical.

The explanation for the effect is believed to be the following. Ammonia decompsoes considerably at elevated temperatures and it is therefore likely that nascent nitrogen in an active form is transported through the silicon oxide layer to the surface and reacts there with the silicon to form the desired silicon nitride buried zone. While we believe the latter to be the correct explanation, it is also possible that the reaction takes place via a reduction of some silicon oxide near or at the silicon surface. The invention is not restricted to an nitridation treatment with ammonia. For example, hydrazine, $N_2H_4$, can also be employed; in general, any treatments can be used in which active nitrogen is formed which is capable of diffusing through the silicon oxide and reacting with silicon to form the nitride. Such active nitrogen can also be obtained, for example, via a gas discharge in a nitrogen-containing atmosphere. The source of the active nitrogen need not even be gaseous. In a selective oxidation process carried out under proper conditions, a comparatively narrow silicon nitride buried zone will be formed along the edge of the oxidation mask when it consists of a silicon nitride layer on a silicon oxide layer.

Generally speaking, the nitride zones that are formed by nitridation will be thin, since the formed nitride blocks out the active nitrogen and prevents further nitridation. Hence the process is somewhat self-limiting in that after the first 10 A or so of nitride is formed, the thickness grows very slowly and, unless special measures are taken, such as higher gas pressures, rarely exceeds 50 A.

As mentioned, the preferred mode is to form the buried nitride zone by heting the oxide covered silicon in an ammonia-containing inert gas at an elevated temperature. A preferred range of temperatures is 900°–1200° C, with ammonia content of 1 – 50%, for a time of at least ½ hour. Generally, longer heat treatments cause little change in the nitride thickness. Higher temperatures generally produce a thicker nitride. The typical nitride formed under the oxide by nitriding in $NH_3$ gas will generally have a thickness between 10 and 20 A. We have verified the existence of the nitride by removing the covering oxide by etching in buffered HF, and making measurements of the surface by Ellipsometry and Auger-Spectroscopy which indicate that a thin nitride phase remains on the silicon surfce. Moreover, we have verified the existence of this nitride zone by subjecting the wafer to various oxidation treatments, which we know should cause an oxide to grow on the silicon or an existent oxide to thicken, but have observed that no significant oxide growth or thickening occurred, which can only be explained by the existence of an oxidation-resistant mask on the surface. Moreover, as will be apparent from the various embodiments described hereinafter, the results described could not be obtained without postulating the existence of this thin nitridezone under the oxide.

No buried nitride is formed during a nitride deposition process which involves heating of oxide-covered silicon in a $SiH_4 - NH_3 - N_2$ gas flow (or similar gases at 900° – 1100° C because it generally takes a minimum time of exposure for the nitrogen to pass through the oxide and nitridation occur at the interface, but that minimum time is not attained because the deposited nitride layer on the oxide grows much faster and masks the underlying silicon from any active nitrogen thereby preventing nitridation of the silicon. Hence our nitridation process requires that the surface of the wafer be free of a complete nitrogen mask thereby to allow access of the silicon to the active nitrogen after diffusion through the oxide. As will be described in greater detail later, in one embodiment of the invention, a limited area silicon nitride zone will be formed under a limited area deposited nitride which is considerably larger than that of the zone due to lateral diffusion of active nitrogen.

The manner in which the formed buried nitride zone can be used will become apparent from the detailed description that follows of a number of different embodiments. Generally speaking, the known properties of silicon nitride, for example, masking in oxidation and diffusion processes, are taken advantage of. Selective removal by etching can also be employed. Since the silicon surface is of good quality below the thin buried nitride zone and remains that way, the latter is very suitable for passivation of the silicon surface. Thus the nitride zone will be retained in the complete device which will thus exhibit improved or more stable properties as a result. It will become apparent that the manufacture of semiconductor devices by means of the method according to the invention often becomes simpler, and that methods may be used which have so far not been used frequently owing to known drawbacks.

EXAMPLE I

This example (see FIGS. 1 to 3) describes the manufacture of a charge transfer device having an electrode system formed by a number of electrodes 4, 5, 6, 7 and 8 separated from a silicon region 1 by a nitrogen-containing and a silicon oxide-containing insulating system of layers 2, 3. By means of these electrodes, charge can be stored in the silicon region and be transported from one storage site to the next storage site through the silicon region. Of importance in the manufacture of such a device is the capacitance of the electrodes relative to the region and obtaining electrodes separated by a very short distance (interelectrode gap). The method of the invention enables obtaining a device with short interelectrodes gaps and with substantially equal electrode capacitances.

Figure 1:
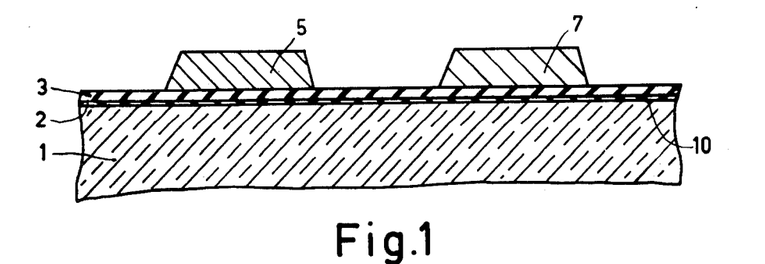
FIGS. 1 to 3 are diagrammatic sectional views of the manufacture of a first semiconductor device according to a first embodiment of the invention in a number of successive stages of its manufacture.
Figure 2:
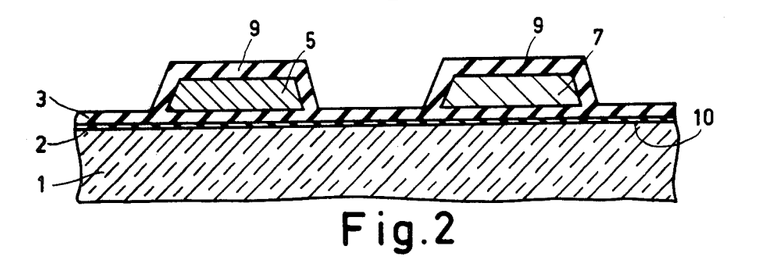
Figure 3:
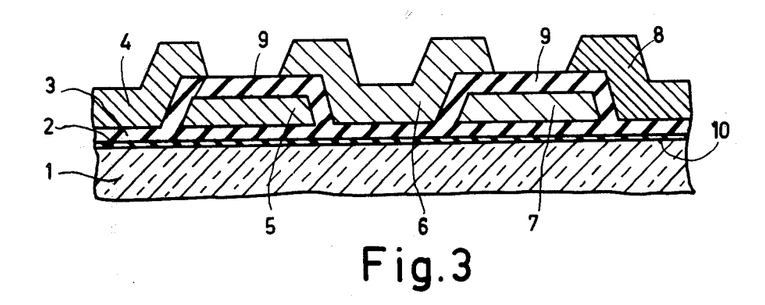

In the known conventional manufacture in which a nitride layer 2 is not present and thus the oxide layer 3 is directly on the silicon 1, the electrodes 5 and 7, in order to realize electrodes 4, 5, 6, 7, 8 spaced a short distance from each other, are manufactured in a usual manner from polycrystalline silicon, for example, by gaseous phase deposition and photoetching. The polysilicon is next provided with a silicon oxide layer 9 by oxidation and the electrodes 4, 6, 8 are then provided on the silicon oxide layer 3, 9. The electrodes 4, 6, and 8 may also consist of polysilicon or of metal. When providing by oxidation the silicon oxide layer 9 on the polysilicon 5, 7, the oxide layer 3 between the electrodes 5 and 7 should be masked with an oxidation mask, for which an alignment and photoetching step are necessary in addition to a vapor deposition step. Otherwise, if no masking is used, the silicon oxide layer 3 between the electrodes 5 and 7 also grows beyond the electrodes 5 and 7 so that the dielectric below the later-applied electrodes 4, 6 and 8 obtains a thickness which is greater than that below the electrodes 5 and 7. As a result of this, the capacitance of the electrodes 4, 6 and 8 relative to the region 1 is smaller than that of the electrodes 5 and 7, which may be disadvantageous for the operation of the device.

In order to obtain a uniformly thick dielectric with the fewest possible treatment steps, in accordance with the invention, after the surface 10 of the silicon region 1 is provided with a silicon oxide-containing layer 3, the silicon region 1 is then subjected to a nitridation treatment in which a functional zone 2 consisting of a nitrogen-containing material is formed between the silicon oxide layer 3 and the silicon region 1. The layer 3 is formed, for example, by thermal oxidation of the region 1 for 45 minutes in oxygen at 1100° C and has a thickness of 0.1 $\mu$m. The nitride zone 2 extends as a continuous thin layer below the whole layer 3 and is formed, for example by leading a gas flow having 5% NH$_3$ in N$_2$ as a carrier gas over the region 1 and the layer 3 while heating at 1000° C for 16 hours. The formed nitride layer 2 then has a thickness of approximately 10 Å.

After the formation of the electrodes 5 and 7 in the usual way, the later 3 and the electrodes 5 and 7 may not be subjected without a mask to a usual oxidation treatment to form the oxide layer 9 without the layer 3 between the electrodes 5 and 7 growing. In this case actually the buried nitride zone 2 is used as a mask against further oxidation of the region 1 due to subsequent processing at an elevated temperature. In the semiconductor device thus manufactured, the presence of the silicon nitride zone 2 has the additional advantage that the number of centers at or near the surface 10 which can detrimentally influence the operation of this type of semiconductor device is small. The flow of ammonia used may contain a higher percentage of ammonia. For considerations of safety it remains preferably lower than 50%.

In Example I, the nitridation treatment of the silicon region and the silicon oxide layer was carried out at an elevated temperature in an ammonia-containing atmosphere; in the following embodiment another nitridation treatment is described.

EXAMPLE II

In this example (see FIGS. 4 to 8) the manufacture is described of a planar semiconductor device having a p-n junction of which, at the area where the p-n junction touches an oxide layer, the breakdown voltage is increased by causing the concentration profile of the p-n junction near the oxide layer to deviate in a suitable manner from that of the central part of the p-n junction. Although it is known per se that the breakdown voltage can be favorably influenced by the choice of the concentration profile, the method according to the invention offers the possibility of manufacturing such a device in a simple manner and with great precision.

Figure 4:
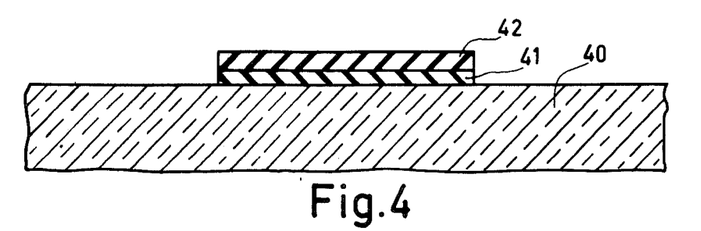
FIGS. 4 to 8 are diagrammatic sectional views of the manufacture of a second semiconductor device in a number of successive stages of its manufacture by means of a second embodiment of a method according to the invention.
Figure 5:
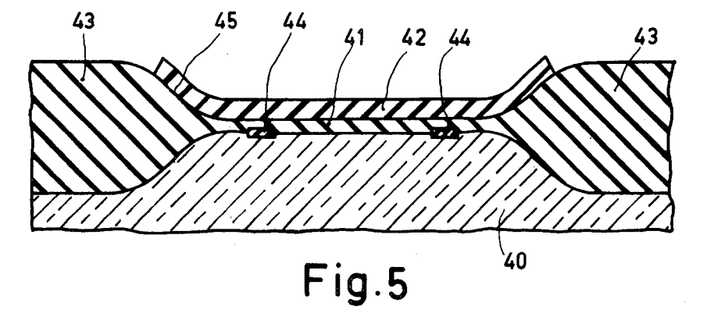

In this embodiment, a 0.5 $\mu$m thick silicon oxide layer 41 is formed in a usual manner on a silicon region 40 of the n-type and a 0.15 $\mu$m thick silicon nitride layer 42 is deposited in a known manner from a gaseous phase on the layer 41. The layers 41 and 42 form a pattern which serves as a mask for the selective oxidation with steam of the silicon region to obtain a sunken oxide pattern 43. Below the silicon nitride layer 42 and the silicon oxide layer 41 and at a short distance from the edge of the mask, it is found that a narrow annular silicon nitride zone 44 is formed which in accordance with the invention is used in a following phase of the manufacture.

It is to be noted that, although the deposited nitride layer 42 is the actual oxidation masking layer, the oxide layer 41 is usually also used because a silicon nitride layer deposited directly on silicon causes many imperfections at the silicon-silicon nitride interface.

During oxidation with steam, for example, for 16 hours at 1000° C, during which the oxide pattern 43 is formed in a thickness of 2 $\mu$m, steam also reacts with the silicon nitride of the layer 42, although to a considerably smaller extent than with the silicon, at the surface of the layer 42, for example, at the interface 45 of the layer 42 with the oxide layer 41 and the pattern 43, respectively. Active nitrogen is formed by this reaction which is transported to the silicon region 40 through the oxide and becomes manifest in the formation of the silicon nitride zone 44. The zone 44 that forms is approximately 1 $\mu$m wide and is at a distance of approximately 2 $\mu$m from the edge of the silicon nitride layer 42. The thickness of the zone 44 cannot be measured directly but has similar properties to the nitride zone 2 in the previous example and will thus have a thickness of approximately the same value.

As has been noted, the reaction of the steam with silicon nitride is restricted, so the buried zone 44 will not extend far below the deposited nitride layer 42 and will not project beyond the layer 42 either since at that area the competitive reaction of steam with silicon predominates. Thus we believe the zone 44 is narrow because on the one hand the active nitrogen released by reaction of the steam with the nitride mask has already with the silicon surface before it has been transported far along the surface through the silicon oxide layer, and on the other hand because below the sunken oxide pattern the steam concentration is too high to enable there nitride formation at the silicon surface. In general then the nitride zone 44 forms only where the active nitrogen concentration is sufficiently high, and the concentration of the oxidizing steam sufficiently low. Moreover, it will be further evident that, as the deposited nitride 42 is made narrower, the formed nitride zones 44 (which is a single annular zone but appears as spaced zones in cross-section) approach one another and will eventually overlap forming a continuous buried nitride zone for a narrow deposited nitride mask. Thus, the geometry of the nitride mask 42 can be said to determine the form and location of the buried nitride zone 44.

Figure 6:
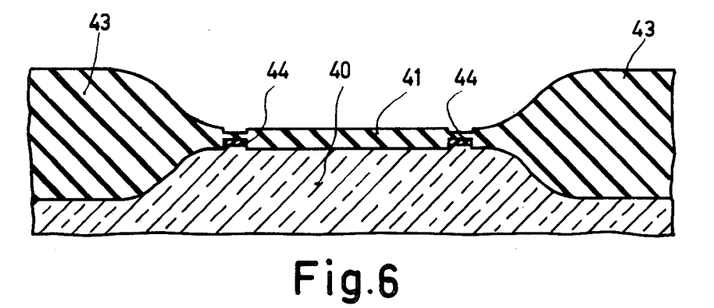

In this example, a mesa was formed in the silicon region and is surrounded by sunken oxide 43. Afterwards, the deposited silicon nitride layer 42 is removed. An oxidation treatment is then carried out again in which the annular zone 44 is used as an oxidation mask in a manner analogous to the preceding example, namely with an oxidation treatment in oxygen for 45 minutes at 1100° C, during which the thickness of the sunken oxide pattern 43 and of the oxide layer 41 increases, the latter by 0.1 μm, with the exception, however, of the part of the layer 41 which is present above the buried nitride zone 44. This is shown in FIG. 6, which also shows the step in the oxide 41 over the nitride 44.

Figure 7:
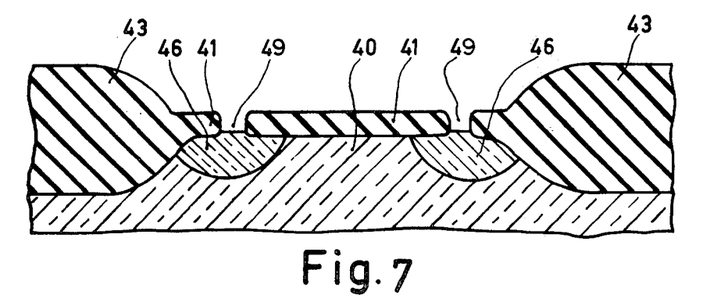

The oxide layer 41 is then removed partly in a usual manner by etching until the nitride zone 44 is exposed, the oxide layer above it being thinner, after which the nitride zone 44 is removed. Conventional etchants can be used for the oxide 41 and nitride 44. Apertures 49 are thus formed in the layer 41 as shown in FIG. 7, via which apertures an annular doped layer 46 of the p-type adjoining the sunken oxide pattern 43 is formed by diffusion in the usual manner using the thickened oxide layer as a diffusion mask. It is also possible to implant a dopant in the silicon region to obtain the layer 46 without removing the nitride zone 44 and without partially removing the oxide layer 41, using the thickened silicon oxide layer 41 elsewhere as an implanting mask.

Figure 8:
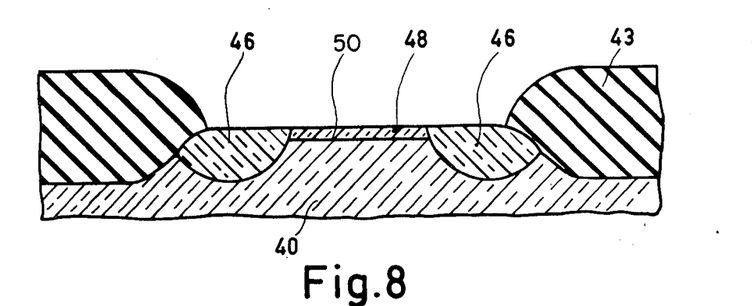

The oxide layer 41 is then removed and a dopant is again introduced into the silicon region 40 to obtain a second doped layer 48 of the p-type with a smaller depth than the layer 46, a p-n junction 50 being formed, as illustrated in FIG. 8.

The annular p-type layer 46 which intersects the sunken oxide 43 is lower doped and/or given a smaller concentration gradient than the shallower p-type layer 48 so that the breakdown voltage of the p-n junction at the pattern 43 is increased. The advantage of the use of the silicon nitride zone 44 to obtain the layer 46 is that no additional masking and alignment step is necessary.

Instead of the formation of the second doped layer 48, the silicon region 40 and the annular layer 46 may be provided with an electrode comprising a layer which forms a Schottky junction with the silicon region and with the annular layer to form a Schottky diode. The electrode layer can consist, for example, of platinum, nickel or platinum silicide.

From the above it is evident that a silicon nitride zone 44 can be formed below the system of layers 41, 42 masking against oxidation during an oxidation treatment to form a sunken oxide pattern as described above. If such a narrow nitride zone 44 is not desired, it may be subsequently removed, for example, simultaneously with the removal of the layer 41 or by a separate etching step following removal of the oxide 41. However, a simpler solution, in accordance with the invention, is to prevent the formation of the narrow or restricted silicon nitride zone 44 when a sunken oxide pattern is to be formed by extending the buried zone 44 completely under the oxide 41. In this case, after the formation of the oxide layer 41 and prior to the deposition of the silicon nitride layer 42, the silicon region 40 is subjected to a nitridation treatment forming a buried nitride zone underneath the oxide 41. Then the nitride layer 42 is deposited. The system of layers thus formed comprising the silicon nitride zone formed during the nitridation treatment, the silicon oxide layer and the silicon nitride layer, after suitable patterning, is then used as a mask during the oxidation treatment to form the sunken oxide 43.

The annular doped region 46, in the Example illustrated, results in increased breakdown voltage of the junction. By making the doped region 46 of the same type but greater conductivity as that of the substrate 40, the region 46 can be used as a channel stop.

EXAMPLE III

This Example (see FIGS. 9 to 12) describes the use of properties other than oxidation masking of the silicon nitride zone formed in accordance with the invention in the manufacture of a silicon gate MOS transistor.

Figure 9:
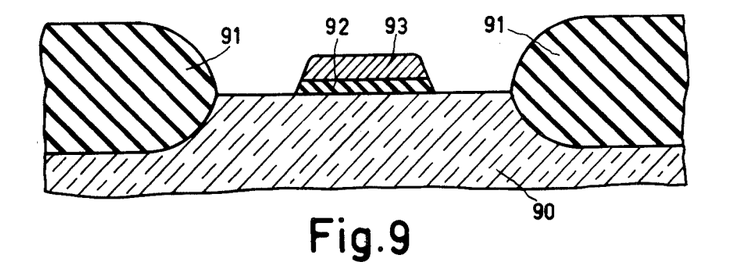
FIGS. 9 to 12 are diagrammatic sectional views of the manufacture of a third semiconductor device according to a third embodiment of the invention in a number of successive stages of its manufacture.
Figure 10:
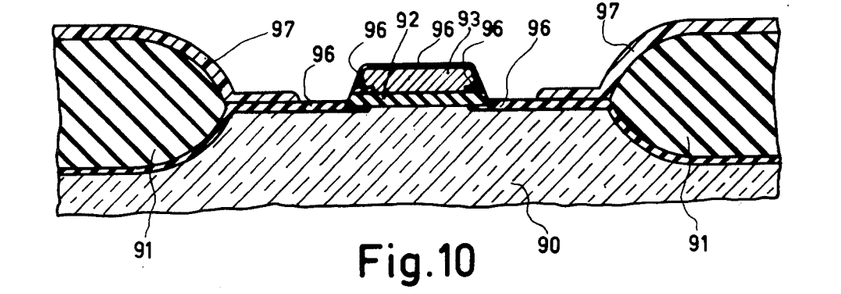
Figure 11:
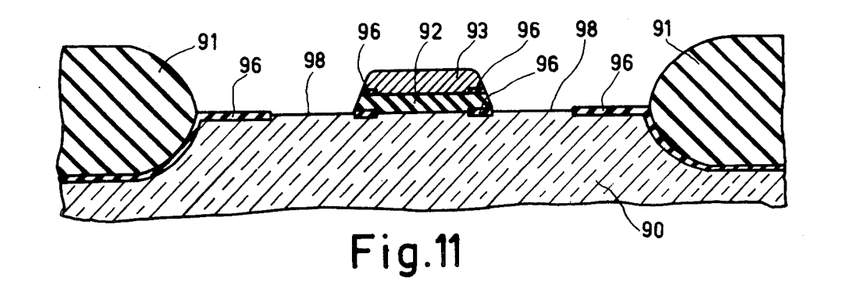

In a manner corresponding to that described with reference to FIGS. 4 and 5, a p-type silicon region 90 is provided with a sunken oxide pattern 91 by selective oxidation. Any nitride zone formed along the edge of the pattern 91 is removed by etching, as has already been stated, after which an oxide layer 92 and a polysilicon layer 93 are formed in the usual manner by oxidation and deposition followed by photoetching steps.

If one followed the prior art method, an n-type impurity could then be deposited on the exposed silicon, and n-type source and drain regions would be formed during an oxidation drive-in treatment, the polysilicon layer 93 also becoming n-type during this step. In this combined oxidizing diffusion (drive-in) treatment, oxide also grows over the exposed silicon in which apertures or windows have then to be etched to contact the source and drain regions. In order to save on silicon real estate, the source and drain regions are kept as narrow as possible, which implies that the contacts on said regions become located near or against the sunken pattern 91. As a result, great care has to be exercised that during etching of the grown oxide along the pattern 91, the p-n junctions between the source and drain, and the substrate 90, are not exposed.

In accordance with the invention, contact windows are defined on the exposed silicon prior to the oxidizing diffusion treatment. This can be down as follows. After the deposition of n-type impurity in exposed silicon but before the oxidizing step, a nitridation treatment as described in Example I is carried out, a silicon nitride zone 96 (see FIG. 10) thus being formed. The nitride zone 96 extends below the oxide pattern 91, partly below the oxide layer 92, over the silicon layer 93 and partly between the oxide layer 92 and the silicon layer 93. In a usual manner, apertures 98 (FIG. 11) are then etched in the nitride zone 96 by means of a layer 97 of photolacquer or resist and the part of the zone 96 present on the layer 93 is also removed. Then the oxidizing diffusion treatment is carried out to form (FIG. 12) oxide layer 99, a sunken oxide portion 101, the n-type source region 94 and the n-type drain region 95, after which the exposed remainders of the nitride zone 96 are then removed as by etching, with the result that apertures 100 adjoining the pattern 91 are automatically obtained for contacting the n-type regions 94 and 95. An important space saving on the silicon surface can be obtained by means of the method described while avoiding the drawbacks described. Moreover, the process helps to prevent pin holes and to reduce contact metallization capacitances.

Figure 12:
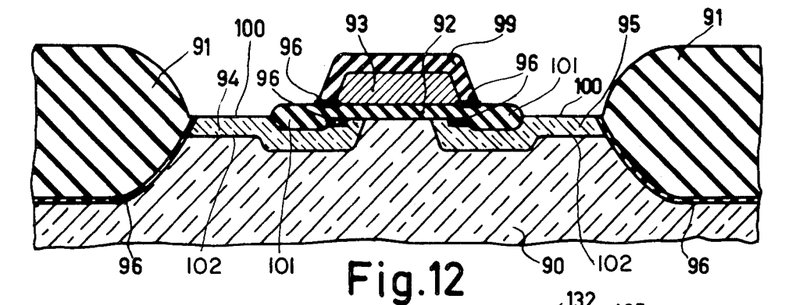
Figure 13:
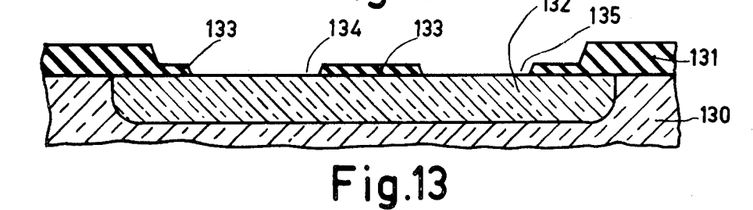
FIG. 13 to 16 are diagrammatic sectional views of the manufacture of a fourth semiconductor device according to a fourth embodiment of the invention in a number of successive stages of its manufacture.

In this example, silicon nitride zone 96 performs a variety of functions. First of all, the definition of the contact windows becomes better because upon making the apertures 100 as by etching the nitride 96 with hot phosphoric acid, there is substantially no possibility for the oxide pattern 91 to be attacked and p-n junctions 102 to be exposed. Furthermore, the nitride zone 96 below the oxide pattern 91 passivates the p-n junction present at that area. The nitride zone 96 also inhibits the out-diffusion of the usual acceptors, for example boron, from the silicon substrate region 90 into the pattern 91 so that channel formation below the pattern is prevented and the nitride zone 96 hence promotes a homogeneous acceptor concentration in the region 90 during thermal treatments.

It will furthermore be obvious that, if one starts with an n-type substrate region, and p-type source and drain regions 94 and 95 are to be formed during the oxidizing diffusion treatment, the presence of the nitride zone 96 below the oxide pattern 91 counteracts the out-diffusion of boron from the source and drain regions into the pattern and promotes good contacting along the edge of the pattern.

As was the case in Example I, the effect of the silicon nitride zone 96 below the silicon oxide layer 92 is that upon oxidation of the polysilicon layer 93, the silicon region 90 below the layer 912 is at most oxidized to a small extent so that curling up of the layer 93 during oxidation is counteracted. For the rest, immediately after the formation of the sunken oxide pattern 91, the nitride zone 96 may be formed below said pattern. That silicon nitride layer then serves as a nitridation mask during the subsequent nitridation step.

EXAMPLE IV

In this example (see FIGS. 13 to 16) is described the manufacture of a bipolar transistor of small dimensions in which a silicon nitride zone below an oxide layer serves as a passivation and the part of the nitride zone beyond the oxide layer serves as a diffusion mask.

Figure 14:
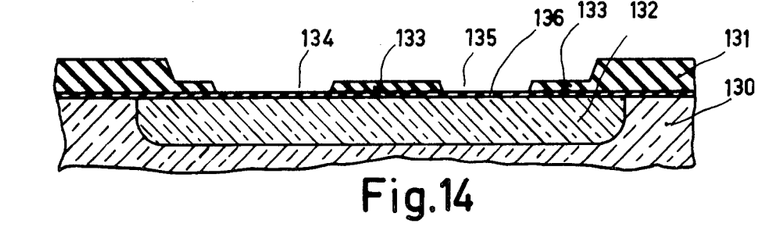
Figure 15:
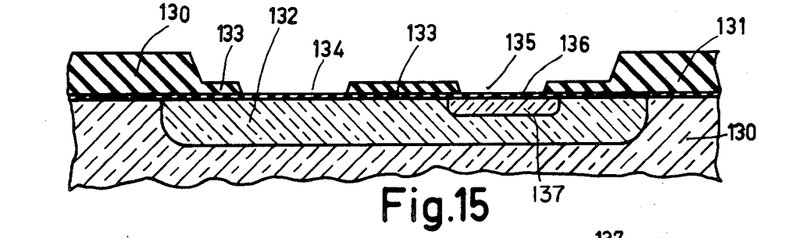
Figure 16:
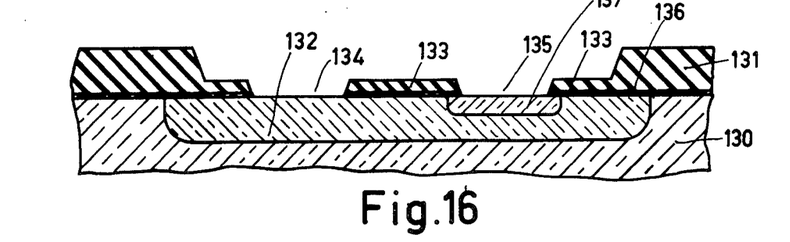

A silicon region 130 of the n-type is provided with a silicon oxide layer 131 so that via an aperture a base region 132 of the p-type is diffused and a thinner oxide layer 133 is formed. By means of one mask, windows 134 and 135 are made in the oxide layer 133, after which via the layers 131 and 133 and in the windows 134 and 135 a silicon nitride zone 136 is formed by nitridation treatment as in Example 1 in accordance with the invention (FIG. 14). The part of the nitride zone 136 in the window 135 is then removed and an emitter region 137 of the n-type is diffused (FIG. 15), the part of the nitride zone 136 in the window 134 masking against diffusion. The part of the nitride zone 136 in the window 134 is then also removed (FIG. 16), after which the regions 132 and 137 may be contacted in the usual way. The process is similar to so-called emitter wash processes except that a single mask is employed for both the washed emitter and base contact windows.

EXAMPLE V

The following Example (see FIGS. 17 and 18) explains how a genetic silicon nitride zone is used for passivation, as an oxidation mask, and to obtain a desired doping profile.

Figure 17:
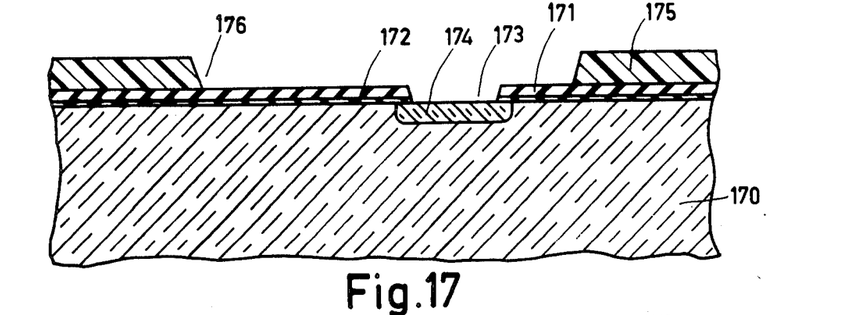
FIGS. 17 and 18 are diagrammatic sectional views of the manufacture of a fifth semiconductor device according to a fifth embodiment of the invention in a number of successive stages of its manufacture.
Figure 18:
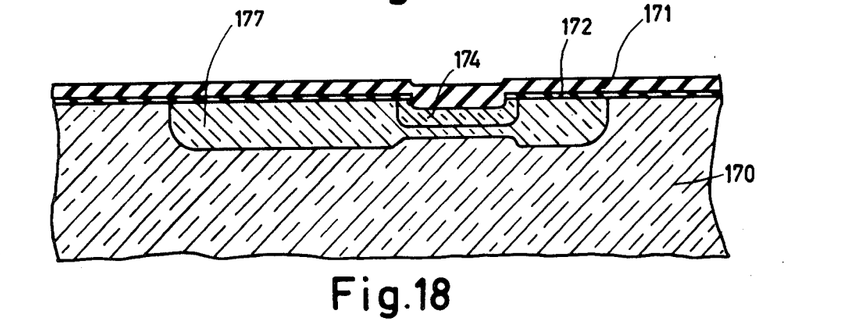

A silicon oxide layer 171 is formed on a silicon region 170 of the n-type and is subjected to a nitridation treatment in accordance with the invention so as to obtain a buried silicon nitride zone 172. A window 173 is made in the oxide layer 171 and the nitride zone 172 and an n+ type emitter region 174 is formed by diffusion of arsenic. A layer 175 of photolacquer or resist having a wide window 176 is then provided on the layer 171. The layer 175 serves as a mask for the implantation in the silicon of boron ions via the layer 171 and the nitride zone 172. The resist layer 175 is then removed, after which a base region 177 having a boundary as is shown diagrammatically in FIG. 18 is formed by an oxidizing diffusion as drive-in treatment. A comparatively thick oxide layer then grows only above the emitter region 174 due to the oxidation masking effect elsewhere of the zone 172. Below the emitter region 174 the boron concentration in the base region 177 is not very high due to out-diffusion into the oxide layer. Below the nitride zone 172, the base region 177 has a higher boron concentration than below the emitter region as a result of the masking effect of nitride zone 172 against out-diffusion. Contacts to said regions may be provided via the oxide layer 171 above the emitter region 174 and via the layer 171 and the nitride zone 172 above the base region 177.

EXAMPLE VI

With a silicon oxide layer on a silicon region, the surface conductivity of the silicon may still be influenced by implantation of ions in the silicon oxide layer and/or the silicon region. A thermal (annealing) treatment is then necessary to remove surface damage from the region. Another known process to influence the silicon surface conductivity involves a thermal treatment at, for example, 600° C in oxygen, but in this case both the charge in the oxide and the number of surface centers are varied. Since upon using the method according to the invention a silicon nitride zone is obtained having a readily defined interface, a process can be employed to vary the electric surface conductivity in the silicon region below the silicon nitride zone after the nitridation treatment without substantial variation in numbers of centers at the interface. It has been found that with a thermal treatment at 600° C which is preferably carried out in an oxygen atmosphere the oxide charge becomes more positive but the number of surface centers remains small. An ion implantation treatment can be preferably used to vary the surface conductivity after the nitridation treatment in which case a thermal treatment may then often be omitted. A silicon oxide layer thus treated is preferably used as gate insulation in a MOS transistor.

In this Example (see FIG. 19), an illustration will be given of a thermal treatment in an oxygen atmosphere of a silicon oxide layer on a silicon nitride zone, in which the charge in the oxide layer is varied without the number of centers between the oxide layer and an adjoining silicon region being considerably varied. By means of such a treatment, an MOS transistor of the depletion type can be made. It is moreover demonstrated in this Exmaple that this treatment for a device in which several MOS transistors are present can be limited to only some of the MOS transistors, so that MOS transistors of the depletion type are obtained in addition to MOS transistors of the enhancement type in the same chip.

Figure 19:
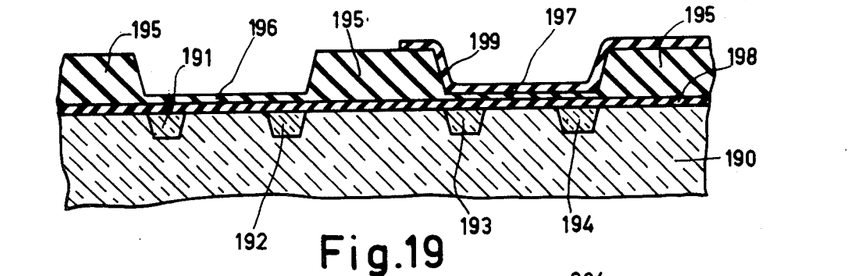
FIG. 19 is a diagrammatic sectional view of the manufacture of a sixth semiconductor device according to a sixth embodiment of the invention in a stage of its manufacture.

N-type regions 191, 192, 193 and 194 are diffused in a silicon region 190 of the p-type. The regions 191 and 192 are source and drain regions for a first MOS transistor and the regions 193 and 194 are source and drain regions for a second MOS transistor. A thick field oxide layer 195 is grown over the surface of the regions 190 to 194, of which parts are removed above the respective transistors and are replaced by new thin gate oxide layers 196 and 197. A buried silicon nitride zone 198 is then formed by a nitridation treatment via the silicon oxide layers 195, 196 and 197. By deposition and a photoetching treatment, a silicon nitride layer 199 is laid across the gate insulation 197. The resulting structure is then maintained at 600° C in an oxygen atmosphere for 1 hour, as a result of which positive charges are introduced into the gate insulation layer 196 of the first transistor but the number of surface states between the nitride zone 198 and the region 190 does not vary noticeably. As a result of the screening action of the deposited nitride layer 199, the charge concentration in the gate insulation layer 197 of the second transistor remain unvaried. The deposited nitride layer 199 is then removed. MOS transistors can be obtained in the usual manner via contacting of the source and drain regions 191 to 194 and providing gate metallizations. As a result of the positive charges in its gate dielectric, the first MOS transistor is of the depletion type, whereas the second MOS transistor remains of the enchancement type. With a suitable choice of the doping concentration in the silicon region, the threshold voltage of the depletion MOST can be made, for example, − 3V, and the threshold voltage of the enchancement MOST + 1V.

The presence of the silicon nitride zone 198 below the gate insulation consisting of silicon oxide is generally useful to avoid variations in the number of centers during thermal treatments in the manufacture of the MOS transistors. If desired, the electric surface conductivity in the silicon region below the silicon nitride zone can be varied, for example, by ion implantation in and/or via the silicon oxide layer and the silicon nitride zone.

EXAMPLE VII

When using silicon oxide layers as diffusion masks a subsequent thermal treatment in hydrogen is often used to reduce the number of centers below the oxide layer. In such use as diffusion masks, charges, for example caused by sodium ions, are also often introduced into the silicon oxide.

Figure 20:
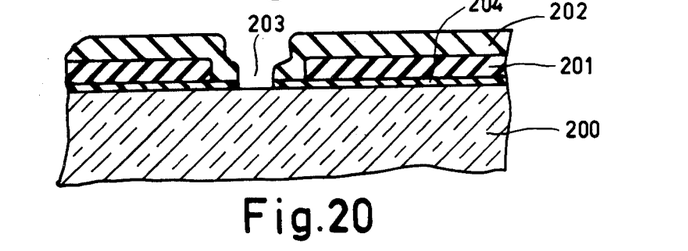
FIG. 20 is a diagrammatic sectional view of the manufacture of a seventh semiconductor device according to a seventh embodiment of the invention in a stage of its manufacture.

The present Example illustrates how to counteract the undesirable introduction of such charges by screening the silicon oxide layer, viewed from the gaseous phase, by a deposited silicon nitride layer. However, the screening nitride layer also screens out hydrogen; hence the thermal treatment in hydrogen will not be effective in reducing centers below the oxide layer. The latter however can be achieved by incorporating a buried nitride zone in accordance with the invention. This is shown in FIG. 20 in which a silicon region 200 is provided with a silicon oxide layer 201 and a deposited silicon nitride layer 202, which latter layer 202 also screens along the edges in a diffusion window 203. The deposited nitride layer 202 not only masks oxide layer 201 against the penetration of charges but also against hydrogen making the hydrogen treatment ineffective. When using the method according to the invention, a buried silicon nitride zone 204 is formed after the formation of oxide layer 201 and prior to the formation of deposited nitride layer 202. A hydrogen treatment at elevated temperature is thereafter not necessary since by means of the nitride zone 204 the number of centers is and remains small.

It will be obvious to those skilled in the art that the examples described are only illustrative of the variety of possibilities which are available without departing from the scope of this invention. For reasons of brevity, details such as those regarding contacting and enveloping which have usually to be used to obtain finished semiconductor devices are omitted from the examples. Sometimes even the type of semiconductor device to be manufactured is not mentioned but some examples relate to several types of semiconductor devices. The devices according to the invention may be both active elements, for example transistors, and passive elements, for example resistors, or integrated circuits which comprise said elements.

In addition to genetic formation by oxidation or thermally, non-genetic oxide layers may also be used. Thus, the silicon oxide layer may also be deposited from the gaseous phase. It may also comprise other silicate-forming materials, for example, aluminum oxide and phosphorus oxide, in addition to silicon oxide. As silicon oxide, said layers will mainly contain silicon dioxide ($SiO_2$) but in addition they may also contain silicon monoxide.

Gallium and aluminum are known as dopants for silicon but are not frequently used because they easily diffuse through an oxide layer. A silicon nitride zone in accordance with the invention can also be used as a part of a diffusion mask for indiffusing gallium or aluminum or like dopants which oxide will not mask. Furthermore, following an in-diffusion step of gallium or aluminum through a silicon oxide layer, active nitrogen can be transported through the silicon oxide to the silicon surface so as to form a buried silicon nitride zone in accordance with the invention in order to counteract out-diffusion of such dopants from the silicon. This would increase the uses of gallium and aluminum in the manufacture of semiconductor devices, which up till now has been limited bacause of the inability to prevent out-diffusion. The ability of the buried silicon nitride zone to prevent out-diffusion can also be applied to dopants such as boron which while masked by oxide will still be absorbed by oxide thus depleting the adjacent silicon surface of boron atoms. The dopants can be introduced into the silicon after the nitride zone has been formed by ion implantation and thus the latter serve solely as an out-diffusion mask. Such a silicon nitride zone is also suitable for use, for example, as a diffusion mask for doping a silicon region with gold or platinum, for instance, for selectively locallizing lifetime killers, or for use as an implantation mask during ion implantation processes. In case in a later stage of the process the presence of the buried nitride zone is not desired, it can be converted to silicon oxide by, for example, steam oxidation even while covered by an existing silicon oxide layer.

The buried silicon nitride zone itself may be formed by implantation of active nitrogen into the silicon surface under the oxide.

The silicon nitride zone also will promote the maintenance of the favorable surface properties of an underlying silicon region when in a later stage of the device manufacture one or more layers of, for example, aluminum oxide, silicon oxide, silicon nitride or glass are formed on the silicon oxide layer.

The screening action of silicon nitride can also be used in a method according to the invention in which a buried silicon nitride zone is not formed along the whole surface between the oxide layer and the silicon region, in that a deposited silicon nitride layer is used to cover a part of the silicon oxide layer to form a nitridation mask. The deposited silicon nitride can be obtained in the usual manner by vapor phase deposition and patterned in the desired form by a photo etching treatment. In this way, selected areas between the oxide and silicon can be provided with the buried nitride zone, and used in the various ways described above. As described in connection with Ex. III above, polysilicon can also be used to mask against nitridation of the silicon.

There has thus been described a method for manufacturing a semiconductor device wherein a silicon nitride zone can be buried at the interface between a silicon surface and a covering oxide phase and which has the capability of maintaining the properties of silicon regions underlying the buried nitride zone while adjacent silicon regions present and not covered by the buried nitride zone have or would have their properties modified during one or more subsequent processing steps. A number of examples of processes in which the properties of the non-covered silicon regions can or would be modified have been provided. The main modification processes include (1) converting any non-covered silicon regions present to an oxide while the buried nitride zone-covered regions are masked against the oxidation, which includes selectively increasing oxide thickness at non-covered silicon regions, (2) in-diffusing conductivity or property modifying impurities into any non-covered regions present while the covered regions are masked against the diffusion, (3) out-diffusion of conductivity or property modifying impurities from any non-covered regions present while the buried nitride zone seals the covered regions and prevents out-diffusion, and (4) heat-treatment in various atmospheres of any non-covered regions present to modify the distribution of imperfections at the surface (e.g., surface states) while the buried nitride zone protects the covered regions against a similar modification. The novel process of the invention when used alone or incorporated in other semiconductor device processes affords an important improvement by making available an additional technique for selectively controlling or modifying silicon surface and bulk properties by means of this buried nitride zone. It will also be clear that if the buried nitride zone is everywhere, rather than at selected areas, then the whole silicon wafer surface is protected against changes in its properties by any subsequent processing which would have effected such changes in any silicon region presents which were not covered by the buried nitride zone.

The above cited embodiments are intended as exemplary only, and while we have described our invention with specific applications and embodiments thereof, other modifications will be apparent to those skilled in the art without departing from the spirit and scope of the invention as defined by the appended claims.

What is claimed is:

1. A method of manufacturing a semiconductor device, comprising providing a body having a silicon semiconductor surface region covered at least partly with a silicon oxide-containing layer, thereafter subjecting the silicon oxide-covered silicon region to a nitriding heat treatment in an atmosphere containing nitrogen capable of passing through the silicon oxide layer and chemically reacting at the silicon-silicon oxide interface until there is formed at the interface a nitrogen-containing material buried zone of a thickness capable of maintaining desired properties of the silicon portion under the buried zone during subsequent processing, and thereafter subjecting the body to processing which would cause a change in the properties of any silicon portions present which are not covered by the buried zone.

2. A method as claimed in claim 1, wherein the silicon oxide-containing layer has a thickness exceeding 100 A.

3. A method as claimed in claim 2, wherein the silicon oxide layer is sunk in the silicon region at least over a part of its thickness.

4. A method as claimed in claim 1, wherein the nitridation treatment is continued until the thickness of the silicon nitride buried zone is larger than 5 A.

5. A method as claimed in claim 1, wherein the nitridation treatment comprises a heat treatment at an elevated temperature in an ammonia-containing atmosphere.

6. A method as claimed in claim 5, wherein the ammonia is supplied in a flowing gas whose volume concentration of ammonia is smaller than 50% by volume.

7. A method as claimed in claim 1, wherein a silicon nitride layer is deposited on a part of the silicon oxide layer before the nitriding treatment, said deposited nitride serving as a nitriding mask to form the buried zone under those portions of the silicon oxide layer not covered with the nitride layer.

8. A method as claimed in claim 1, wherein a silicon nitride layer is deposited on the silicon oxide layer after the nitriding treatment, and thereafter the body is subjected to an oxidation treatment using the system of layers formed by the silicon nitride buried zone, the silicon oxide layer and the deposited silicon nitride layer as an oxidation mask.

9. A method as claimed in claim 1, wherein at least a part of the silicon nitride buried zone is used as an oxidation mask while subjecting the body to a subsequent oxidation treatment.

10. A method as claimed in claim 1, wherein after the nitriding treatment, the silicon region below the silicon nitride buried zone is subjected to a treatment to vary its electric surface conductivity.

11. A method as claimed in claim 10, in that the surface conductivity-varying treatment comprises a thermal treatment.

12. A method as claimed in claim 11, wherein the thermal treatment is carried out in an oxygen atmosphere.

13. A method as claimed in claim 10, wherein the surface conductivity-varying process comprises an ion implantation treatment.

14. A method as claimed in claim 10, wherein an electrode is provided over the silicon oxide layer to form a gate electrode of a MOS transistor.

15. A method as claimed in claim 1, wherein at least two apertures are formed in the silicon oxide layer by means of one mask, and following the nitriding treatment, the buried zone is removed from at least one of the apertures leaving the buried zone inside at least another of the apertures, and modifiers are introduced into the silicon through said one aperture while said other aperture is masked by the remaining silicon nitride buried zone.

16. A method as claimed in claim 1, wherein the silicon nitride buried zone is used as a mask for the selective introduction or emanation of a dopant for the silicon.

17. A method as claimed in claim 16, wherein preceding the use of the silicon nitride buried zone as an emanating mask, a dopant is introduced into the silicon region by ion implantation via the silicon nitride zone.

18. A method as claimed in claim 16, wherein the dopant is selected from the group consisting of boron, aluminum, gallium, gold and platinum.

19. A method of manufacturing a semiconductor device, comprising providing a body having a silicon semiconductor surface region covered at least partly with a silicon oxide-containing layer having a thickness exceeding 100 A, thereafter subjecting the silicon oxide-covered silicon region to a chemical treatment in the presence of active nitrogen capable of passing through the silicon oxide layer and chemically reacting with the silicon surface until there is formed between the silicon oxide layer and the silicon region a nitrogen-containing material buried zone having a thickness exceeding 5 A but less than about 50 A, and thereafter utilizing the thusproduced nitrogen-containing buried zone for selectively controlling properties of the silicon surface.

20. A method as claimed in claim 1 wherein the subsequent processing comprises an oxidation step.

21. A method as claimed in claim 1 wherein the subsequent processing comprises an impurity in-diffusion step.

22. A method as claimed in claim 1 wherein the subsequent processing comprises an impurity out-diffusion step.

23. A method as claimed in claim 1 wherein the subsequent processing comprises a thermal treatment step to modify imperfections.

24. A method as claimed in claim 21 wherein the buried nitride zone is used as a diffusion mask during the in-diffusion step.

25. A method as claimed in claim 1 wherein the silicon oxide-containing layer covers only part of the silicon surface region.

* * * * *